Nov. 17, 1959 R. B. GRAY 2,912,748

METHOD OF MAKING PRINTED CIRCUIT PANELS

Filed May 28, 1956

INVENTOR.
Robert B Gray
BY
Ralph Hammar
attorney 2,912,748

METHOD OF MAKING PRINTED CIRCUIT PANELS

Robert B. Gray, Erie, Pa., assignor to Erie Resistor Corporation, Erie, Pa., a corporation of Pennsylvania Application May 28, 1956, Serial No. 587,579

2 Claims. (Cl. 29—155.5)

This invention is intended to provide printed circuit wiring panels with molded holes for fasteners, tube sockets, terminals, etc. It is particularly useful in devices disclosed in Patent 2,716,268. Molded holes always register with the wiring pattern no matter how the shrinkage in different parts of the panel may vary.

In accordance with a preferred form of the invention, a foil with an underlying adhesive is arranged on a stack of plastic impregnated sheets in a laminating press. Instead of the flat die used in the manufacture of foil clad laminates, the die in contact with the foil has embossing projections corresponding to the desired circuit pattern and tubular projections of greater height than the embossing projections at locations where the finished panel is to have holes. The tubular projections can be of any desired shape, e.g., round, square, rectangular, irregular. When the press is closed, foil is embossed into the laminate in the desired circuit pattern and tubular holes are also embossed in the desired relation to the wiring. The holes ordinarily extend nearly through the laminate. When the laminate is cured, sanding the foil clad surface to a depth greater than the thickness of the foil but short of the embossed portions of the foil leaves only the desired wiring pattern. Sanding the opposite surface of the laminate to a depth intersecting the tubular holes opens up the holes which are lined with foil and are correctly positioned with respect to the wiring. The foil lining provides added surface for soldering.

Figure 1:
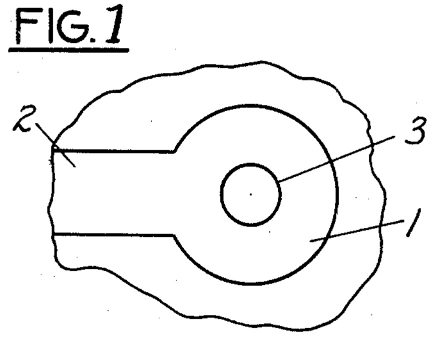
Figure 2:
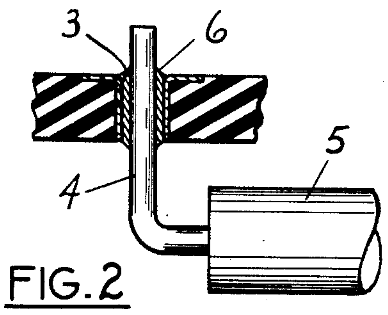
Figure 3:
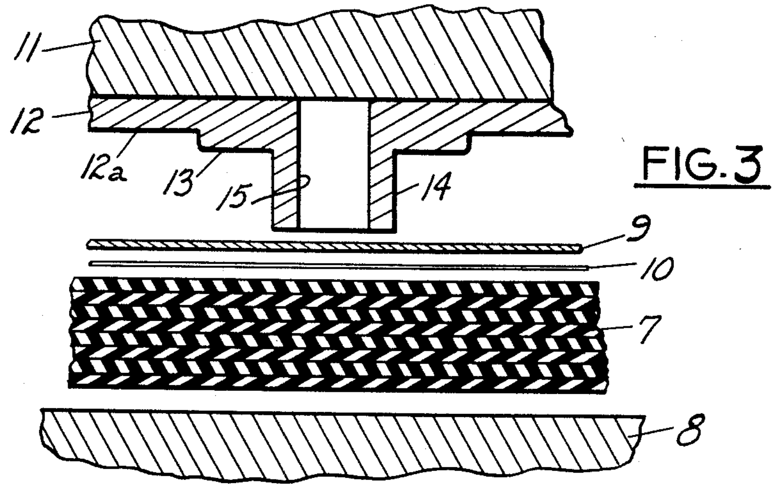
Figure 4:
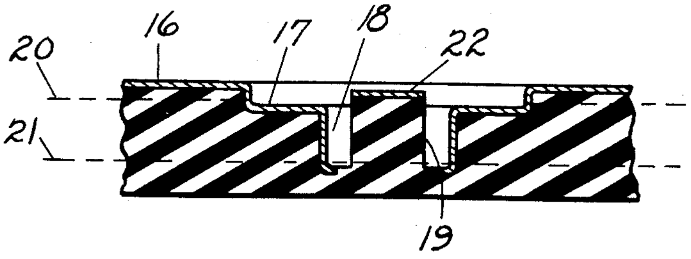

In the accompanying drawing, Fig. 1 is a top plan view of a small portion of a printed wiring panel; Fig. 2 is a section on line 2—2 of Fig. 1; Fig. 3 is an exploded view illustrating the process of manufacture; and Fig. 4 is a fragmentary section through the printed wiring panel at the end of the molding operation but prior to the sanding operations.

In Fig. 1 is shown a small part of a printed circuit wiring panel made in accordance with Patent 2,716,268. The panel will include a great many terminal areas 1 and circuit wiring interconnections 2 arranged to meet the particular circuit requirements. At the center of the terminal area 1 is a hole 3 for receiving a lead 4 of an electric circuit component 5 such as a resistor or condenser. The electrical connection between the lead 4 and the terminal area 1 is effected by solder 6. In addition, other holes may be required in the panels, for example, to receive tube sockets or for receiving fasteners or for mounting the panel or for mounting other devices on the panel. These other holes may be of different size and shape than the hole 3. Heretofore, the most economical way of forming these holes has been by punching dies operating on the finished panels. These punching dies are expensive and while the holes punched are always in fixed relation to each other, variable shrinkage in the plastic resin material of which the circuit panels are most usually made has resulted in mis-registration of the punched holes with individual elements of the panels. For example, shrinkage might displace the hole 3 from the center of the terminal area 1 and if the terminal area were quite small, the displacement might cause the hole to miss the terminal area entirely.

In order to eliminate these problems, the holes desired in the finished wiring panel are molded by tubular projections on the same die which forms the printed wiring. Except for the shape of the die, the method is that shown in Patent 2,716,268 where a plurality of sheets 7 of fiber impregnated with uncured plastic are arranged on a heated lower platen 8. On top of the sheets is arranged a sheet of foil 9 with an underlying film 10 of adhesive which may be a separate film or a coating on the foil or a part of the plastic impregnating the sheets 7. On the underside of an upper heated platen 11 is fixed a relatively thin die 12 which may, for example, be built up by electroplating. The die 12 has projections 13 corresponding to the printed wiring pattern such as the terminal areas 1 and the circuit interconnections 2 and also tubular projections 14 corresponding to the holes to be formed in the printed wiring panel. It will be noted that the tubular projections 14 have center holes 15 which extend clear through the die 12. When the upper and lower platens close under molding pressure, the sheets 7 and the foil 9 are consolidated to the finished shape shown in Fig. 4. When the molded part leaves the press, the foil 9 is adhesively united to the underlying plastic base which has been molded to the shape determined by the die 12 on the upper heated platen 11. In the molded piece shown in Fig. 4, there are sections 16 which are not wanted in the finished printed circuit panel, sections 17 which are to remain in the finished panel and cylindrical indentations 18 corresponding to the holes to be formed in the finished panel. At the center of the cylindrical portions 18 are upstanding projections 19 which correspond to the inside diameter of the tubular projections 14. The upstanding projections 19 are not to remain in the finished panel, but are merely the result of flowing of the fiber and plastic up into the center of the tubular projections 14. The portions 16, which are not wanted in the finished panel, are located at the level of the plane surface 12a on the die 12. The surfaces 17, which are to remain in the finished panel, are located at the level of the projections 13 on the die.

At the end of the molding operation, the entire upper surface of the molded panel is covered with metal foil 9 which is both embossed to the configuration of the die 12 and is adhesively united to the panel. The panel is completed by sanding or cutting away the foil coated surface of the panel to the depth of dotted line 20 and by sanding or cutting away the opposite surface of the panel to the depth of dotted line 21. Both sanding operations removing the material to the depth of lines 20 and 21 in no way affect the configuration of the conducting elements on the circuit panel such as indicated at 1 and 2. These operations require no special tools. The cutting or sanding to the dotted line 20 removes the unwanted parts of the foil and leaves only the parts of the foil which are to form the circuit pattern and which have been embossed below the dotted line 20. The sanding to the depth of the dotted line 21 intersects the side walls of the cylindrical section 18 and leaves only the finished hole formed to the molded panel. The projections 19 obviously fall out of the panel as soon as the sanding reaches the dotted line 21.

Although the molding operation is carried out under heavy pressure, the relatively thin tubular projections 14 are adequate to form the holes. These projections engage the foil first and stretch or form the foil to a cylindrical shape completely lining the hole. This forming operation takes place as the tubular projections 14 sink into the panel. Because the material flows up into the center of the tubular projections 14, the relatively thin walls of the projection are in substantial hydraulic balance so that even though the molding pressures are very high, the walls of the tubular projections 14 can be thin. While the foil does flow or stretch around the outside of the tubular projections 14, it does not flow up along the inner surface of the tubular projections. There will ordinarily be a flat section of foil 22 on top of the projections 19 which flow up into the inside of the tubular projections 14.

The tubular projections 14 can extend nearly through the finished panel. This means that only a small amount of material need be ground off the plain or unclad surface of the panel. It would be possible to have the tubular projections 14 go clear through the panel but this would require very precise control of the thickness of the plastic impregnated sheet, but it is ordinarily more practical to have the tubular projections 14 go from ¾ to ⅞ of the way through the panel. This leaves only a small amount of stock to be removed from the back side of the panel and since the back sides of the panels are usually sanded as part of the manufacture, no additional operations are required to sand the back side of the panel to the depth of the dotted line 21 in Fig. 4.

What is claimed as new is:

1. The method of making printed electric circuit panels which comprises arranging a metal foil on one surface of an uncured deformable base sheet of fibers of insulating material and an impregnating plastic and including adhesive material under the foil, positioning a die on the foil having embossing projections thereon corresponding to the circuit to be printed and further having tubular hole forming projections in fixed relation to said circuit and projecting from the die beyond said embossing projections a distance equal to the desired finished thickness of the panels, pressing the die, foil and base together in a press having platens heated to the flowing temperature of the impregnating plastic under pressure sufficient to emboss the foil under the projections into the underlying surface of the base and maintaining the pressure until the plastic is cured and the foil is united and consolidated with the base, said tubular projections forming annular indentations of size and shape corresponding to the holes desired in the finished panels, cutting away the foil coated surface of the base to a depth below that of the unembossed portions of the foil to leave the embossed portions of the foil united with the base, and removing material from the surface of the base sheet opposite the foil coated surface to a depth intersecting the annular indentations above the bottom surface thereof to form holes through the base sheet.

2. The method of making printed electric circuit panels which comprises arranging a metal foil on one surface of an uncured deformable base sheet of fibers of insulating material and an impregnating plastic and including adhesive material under the foil, positioning a die on the foil having embossing projections thereon corresponding to the circuit to be printed and further having tubular hole forming projections in fixed relation to said circuit and projecting from the die beyond said embossing projections a distance substantially equal to the desired finished thickness of the panels, pressing the die, foil and base together in a press having platens heated to the flowing temperature of the impregnating plastic under pressure sufficient to emboss the foil under the projections into the underlying surface of the base and to extrude sections of foil and plastic up into the tubular projections and maintaining the pressure until the plastic is cured and the foil is united and consolidated with the base, said tubular projections forming annular indentations of size and shape corresponding to the holes desired in the finished panels with walls at the bottom of the indentations joined to the side of the base opposite the foil, cutting away the foil coated surface of the base to a depth below that of the unembossed portions of the foil to leave the embossed portions of the foil united with the base, and severing the extruded sections by severing said walls at the bottom of the indentations to form holes through the base sheet.

References Cited in the file of this patent

UNITED STATES PATENTS

| | | |
|---|---|---|
| 2,669,769 | Peterson | Feb. 23, 1954 |
| 2,716,268 | Steigerwalt | Aug. 30, 1955 |

FOREIGN PATENTS

| | | |
|---|---|---|
| 687,094 | France | Dec. 21, 1929 |